United States Patent
Alvord

(10) Patent No.: US 7,183,934 B2
(45) Date of Patent: Feb. 27, 2007

(54) DIAGNOSTIC CIRCUIT

(75) Inventor: Robert J. Alvord, Elmwood Park, IL (US)

(73) Assignee: Robertshaw Controls Company, Richmond, VA (US)

( * ) Notice: Subject to any disclaimer, the term of this patent is extended or adjusted under 35 U.S.C. 154(b) by 204 days.

(21) Appl. No.: 11/088,118

(22) Filed: Mar. 23, 2005

(65) Prior Publication Data

US 2006/0214810 A1    Sep. 28, 2006

(51) Int. Cl.
   *G08B 21/00*    (2006.01)
(52) U.S. Cl. ............ 340/635; 340/660; 340/661; 324/537
(58) Field of Classification Search ........ 340/635, 340/660, 661; 324/537
   See application file for complete search history.

(56) References Cited

U.S. PATENT DOCUMENTS 5,896,086 A * 4/1999 Ida ................. 340/635

6,456,085 B1 * 9/2002 Dietl et al. ............. 340/635

* cited by examiner

*Primary Examiner*—Jeffery Hofsass
*Assistant Examiner*—Samuel J. Walk
(74) *Attorney, Agent, or Firm*—Reinhart Boerner Van Deuren P.C.

(57) ABSTRACT

A diagnostic circuit is provided. The diagnostic circuit comprises resistors and a capacitor. The diagnostic circuit is monitored to detect the presence of a load and to confirm the proper operation of a relay circuit. The diagnostic circuit generates an oscillating voltage when the relay circuit is open and the load is connected, generates a logic low when the relay circuit is open and the load is disconnected, and generates a logic high when the relay circuit is closed. The diagnostic circuit can be disposed within a diagnostic circuit system that includes one or more of a sensing circuit, a relay circuit, an alternating-current source having a direct current offset, an input circuit, and a high-voltage microprocessor. The high-voltage microprocessor can be bi-directionally optically coupled to an application microprocessor.

20 Claims, 9 Drawing Sheets

FIG. 6
(PRIOR ART)

| RELAY | LOAD | DIAGNOSTIC CIRCUIT |
|---|---|---|
| OPEN | CONNECTED | Sees no Current |
| OPEN | UNCONNECTED | Sees no Current |
| CLOSED | CONNECTED | Sees a Current |
| CLOSED | UNCONNECTED | Sees no Current |

TRUTH TABLE

FIG. 10

| RELAY | LOAD | DIAGNOSTIC CIRCUIT |
|---|---|---|
| OPEN | CONNECTED | Produces Oscillation Signal (About +/- 100V at 60 Hz) |
| OPEN | DISCONNECTED | Produces logic Low (e.g. 0 V) |
| CLOSED | X | Produces Logic High (e.g. 5 V) |

TRUTH TABLE

DIAGNOSTIC CIRCUIT

FIELD OF THE INVENTION

This invention generally relates to diagnostic circuits used to monitor the operation of an electrical component in a floating ground environment. In particular, the invention relates to diagnostic circuits employed in appliances.

BACKGROUND OF THE INVENTION

Current sensing diagnostic circuits are often used in appliances (e.g., refrigerators) to monitor the operation of electrical components such as, for example, relay circuits. Such a current sensing diagnostic circuit is illustrated in simplified schematic form in FIG. 1. If a current begins to flow through the diagnostic circuit when the relay is commanded to close, a sensor detects that current and reports that the electrical component being monitored is operating as intended. If, however, current does not flow through the diagnostic circuit when the relay is commanded to close, the sensor notes the absence of that current and reports to the control and/or microprocessor that the electrical component is not functioning properly. When the electrical component is not working, malfunctioning, and the like, a technician is often summoned to repair and/or replace the electrical component in the appliance. Unfortunately, indication of a failure of the electrical component to function properly can occur when a variety of different faults (e.g., an open load, a disconnected wire, and the like) are experienced and/or the electrical component itself is damaged. Therefore, the technician will have to check a number of different potential problems to determine which electrical component has actually failed, which electrical component needs to be replaced, which leads or connections to check, and the like.

Another method is to look for line voltage at the output of the relay. Referring to FIGS. 2–5, one such conventional voltage sensing diagnostic circuit 10, as known in the art, is illustrated. The known diagnostic circuit 10 includes a variety of resistors 12, 14, 16, 18, and a capacitor 20 coupled together as shown to sense the applied voltage from the relay circuit 22 to the load 24. The diagnostic circuit 10 is typically coupled to a sensing circuit 30 at node 32, which provides the diagnostic information to a controller or microprocessor 42.

The relay circuit 22 includes an electromagnetic coil 34 and a switch 36. The electromagnetic coil 34 is coupled to a direct current power source 38 and a driver circuit 40. The driver circuit 40 is typically commanded by the microprocessor 42 to switch the alternating-current (AC) power source 44 to the load 24.

Referring specifically to FIG. 3, when the electromagnetic coil 34 is de-energized and the switch 36 is open, the diagnostic circuit 10 does not sense any voltage applied to the load 24. This is the normal sense for a relay open condition using this type of current sense circuit 10. Unfortunately, since this conventional circuit 10 detects voltage applied to the load 24, and since the opening of the relay switch 36 ensures that no voltage is applied to the load 24, the circuit 10 does not detect anything different at this point if there is a fault (open circuit) in the wiring to the load as illustrated in FIG. 3 or if the load itself is disconnected. The same can be said for the current sense circuits.

When the relay 22 is closed under normal operation as shown in FIG. 4, the sensing circuit 30 detects the current flow to the load 24. The sensing circuit 30 then communicates that the relay circuit 22 is operating normally as commanded. However, because the circuit 10 is configured to monitor the current flow to the load 24 to determine if the relay 22 is operating properly, a broken wire to the load 24, as illustrated in FIG. 5 (or a disconnection of the load 24 itself) will be flagged as a failure of the relay 22. Unfortunately, this may well lead the technician to replace the relay or the relay board, when in fact the relay 22 and its driver 40 are operating properly. Further troubleshooting would then be required to isolate the problem detected by circuit 10.

For the convenience of the reader, a summary of the operation of the known diagnostic circuit 10 is provided in FIG. 6. As illustrated in the first two rows of the truth table, anytime the switch 36 in relay circuit 22 is open, whether or not the load 24 is connected or unconnected, the sensing circuit 30 sees no current. In contrast, as shown in the third row of the truth table, when the switch 36 in relay circuit 22 is closed and the load 24 is connected, the sensing circuit 30 sees the current flow to that load. This is interpreted as normal relay operation. However, even if the relay 22 operates normally and closes its switch 36, if the load is disconnected, the circuit 10 does not see current flowing to the load. This is reported as a failed relay 22, even though it operated to close its switch 36 when commanded. As a result, faults in the relay circuit 22, the load 24, or elsewhere are difficult to locate, pinpoint, and troubleshoot.

Therefore, a diagnostic circuit that can indicate whether a load is present or missing, as well as determine if a relay circuit is functioning properly, would be desirable. The invention provides such a diagnostic circuit. These and other advantages of the invention, as well as additional inventive features, will be apparent from the description of the invention provided herein.

BRIEF SUMMARY OF THE INVENTION

In one aspect, the invention provides a floating diagnostic circuit coupled to a load node between a relay circuit and a load. The floating diagnostic circuit comprises a first resistor, a capacitor, a second resistor, and a third resistor. The first resistor is disposed between a node and a sensing node. The capacitor is disposed between the sensing node and a ground node. The second resistor is disposed between the node and the ground node. The second resistor is coupled to the first resistor at the node and is coupled to the capacitor at the ground node. The third resistor is disposed between the node and the load node. The third resistor is coupled to the first resistor and the second resistor at the node.

In another aspect, the invention provides a diagnostic circuit system for determining the proper operation of a relay circuit and the status of a connection of a load thereto. The diagnostic circuit system comprises a diagnostic circuit and a sensing circuit.

The diagnostic circuit has a first resistor, a capacitor, a second resistor, and a third resistor. The first resistor is disposed between a node and a sensing node. The capacitor is disposed between the sensing node and a ground node. The second resistor is disposed between the node and the ground node. The third resistor is disposed between the node and a load node. The third resistor is coupled to the first resistor and the second resistor at the node. The sensing circuit is coupled to the diagnostic circuit at the sensing node.

The diagnostic circuit generates a high voltage at the sensing node when the relay circuit is closed, a low voltage when the relay circuit is open and the load is disconnected from the relay circuit, and an oscillating voltage when the relay circuit is open and the load is connected to the relay circuit.

In a further aspect, the invention provides a diagnostic circuit system. The diagnostic circuit system comprises a diagnostic circuit, a relay circuit, and a sensing circuit.

The diagnostic circuit has a first resistor, a capacitor, a second resistor, and a third resistor. The first resistor is disposed between a node and a sensing node. The capacitor is disposed between the sensing node and a ground node. The capacitor is coupled to the first resistor at the sensing node such that the first resistor and capacitor are in series. The second resistor is disposed between the node and the ground node. The second resistor is coupled to the first resistor at the node and coupled to the capacitor at the ground node such that the second resistor is in parallel with the first resistor and the capacitor. The third resistor is disposed between the node and a load node. The third resistor is coupled to the first resistor and the second resistor at the node such that the third resistor is in series with the second resistor and the first resistor and the capacitor.

The relay circuit is coupled to the diagnostic circuit at the load node and the sensing circuit is coupled to the diagnostic circuit at the sensing node. The diagnostic circuit generates, and the sensing circuit detects, one of an oscillating signal, a logic high, and a logic low such that a presence of a load and proper operation of the relay circuit are confirmed.

Other aspects, objectives and advantages of the invention will become more apparent from the following detailed description when taken in conjunction with the accompanying drawings.

BRIEF DESCRIPTION OF THE DRAWINGS

The accompanying drawings incorporated in and forming a part of the specification illustrate several aspects of the present invention and, together with the description, serve to explain the principles of the invention. In the drawings:

FIG. 6 is a truth table summarizing the operational information of the prior art diagnostic circuit systems of FIGS. 2–5;

FIG. 10 is a truth table summarizing the operational information of the diagnostic circuit systems of FIGS. 7–9.

While the invention will be described in connection with certain preferred embodiments, there is no intent to limit it to those embodiments. On the contrary, the intent is to cover all alternatives, modifications and equivalents as included within the spirit and scope of the invention as defined by the appended claims.

DETAILED DESCRIPTION OF THE INVENTION

Figure 1:
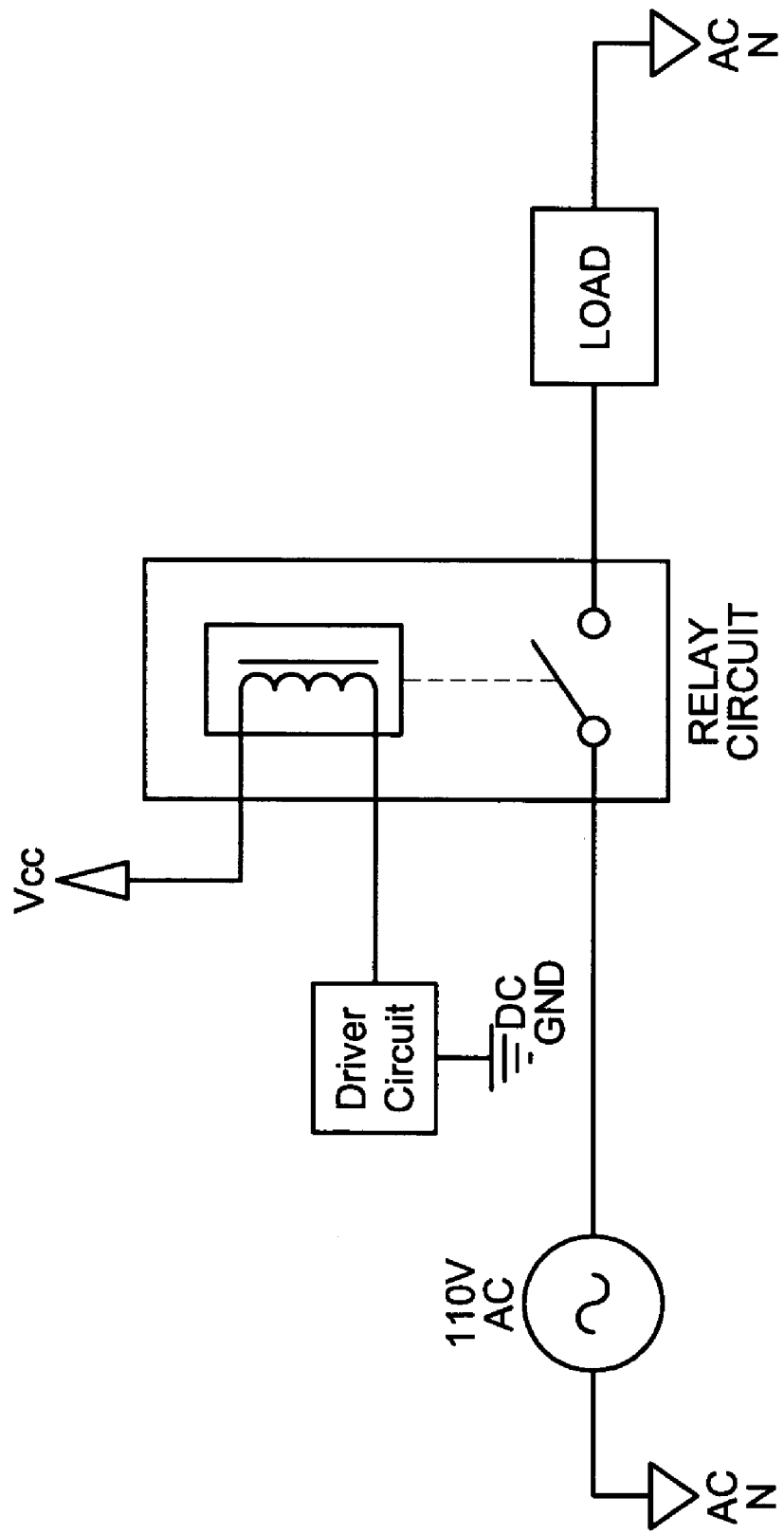
FIG. 1 is a prior art current sensing diagnostic circuit in simplified schematic form.
Figure 2:
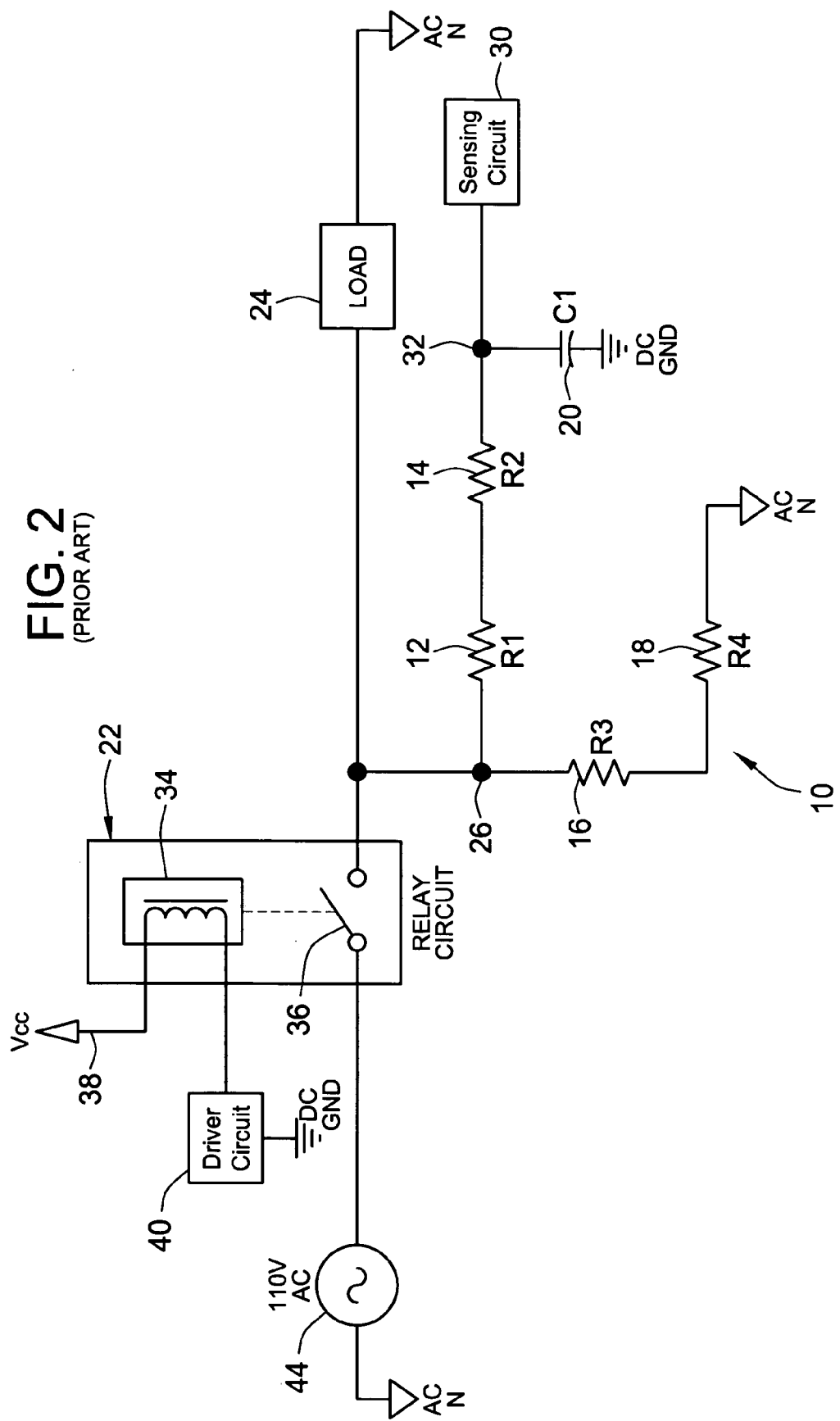
FIG. 2 is a schematic of a prior art diagnostic circuit system having an "open" relay circuit and a connected load.
Figure 3:
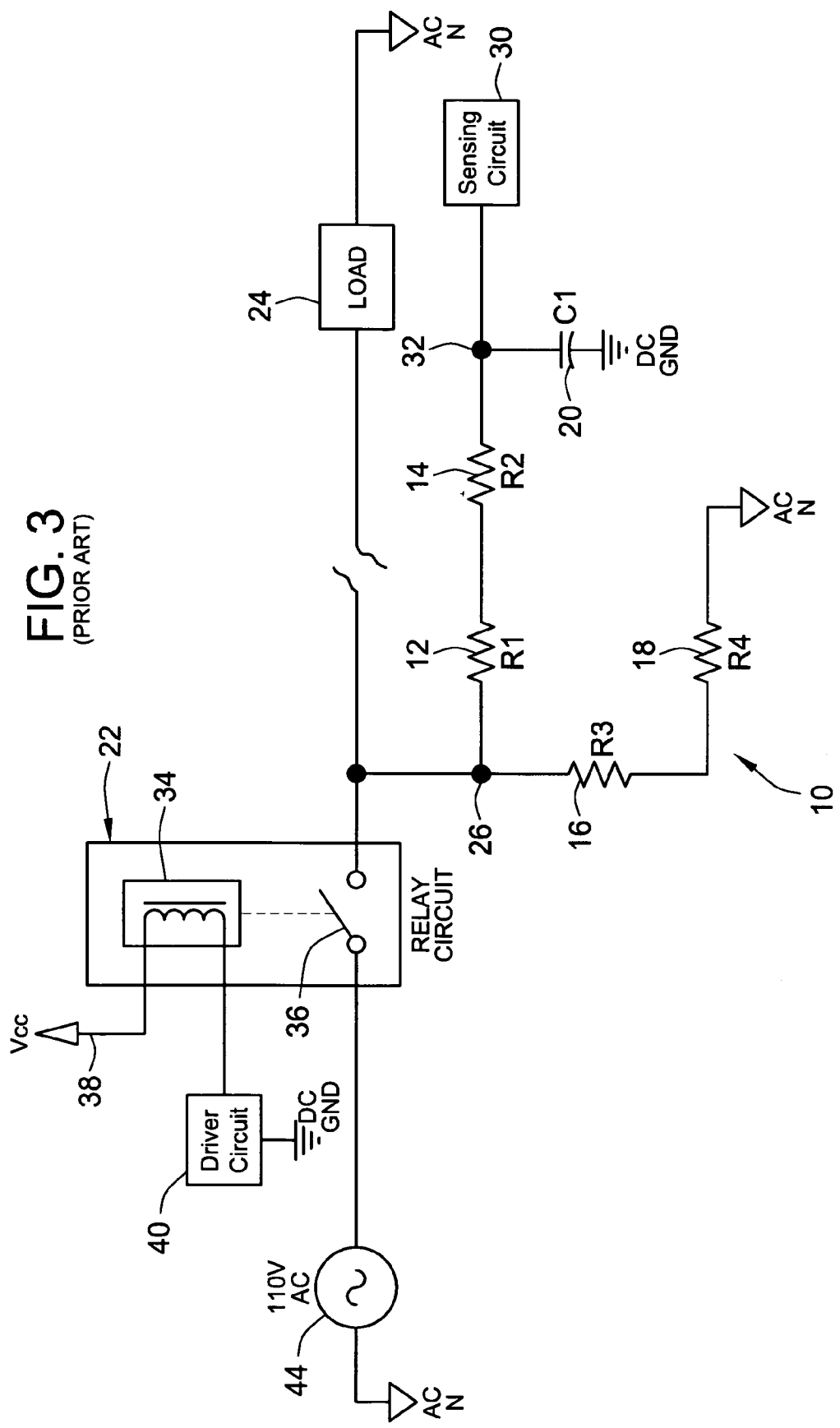
FIG. 3 is a schematic of the prior art diagnostic circuit system of FIG. 2 having an "open" relay circuit and a disconnected load.
Figure 4:
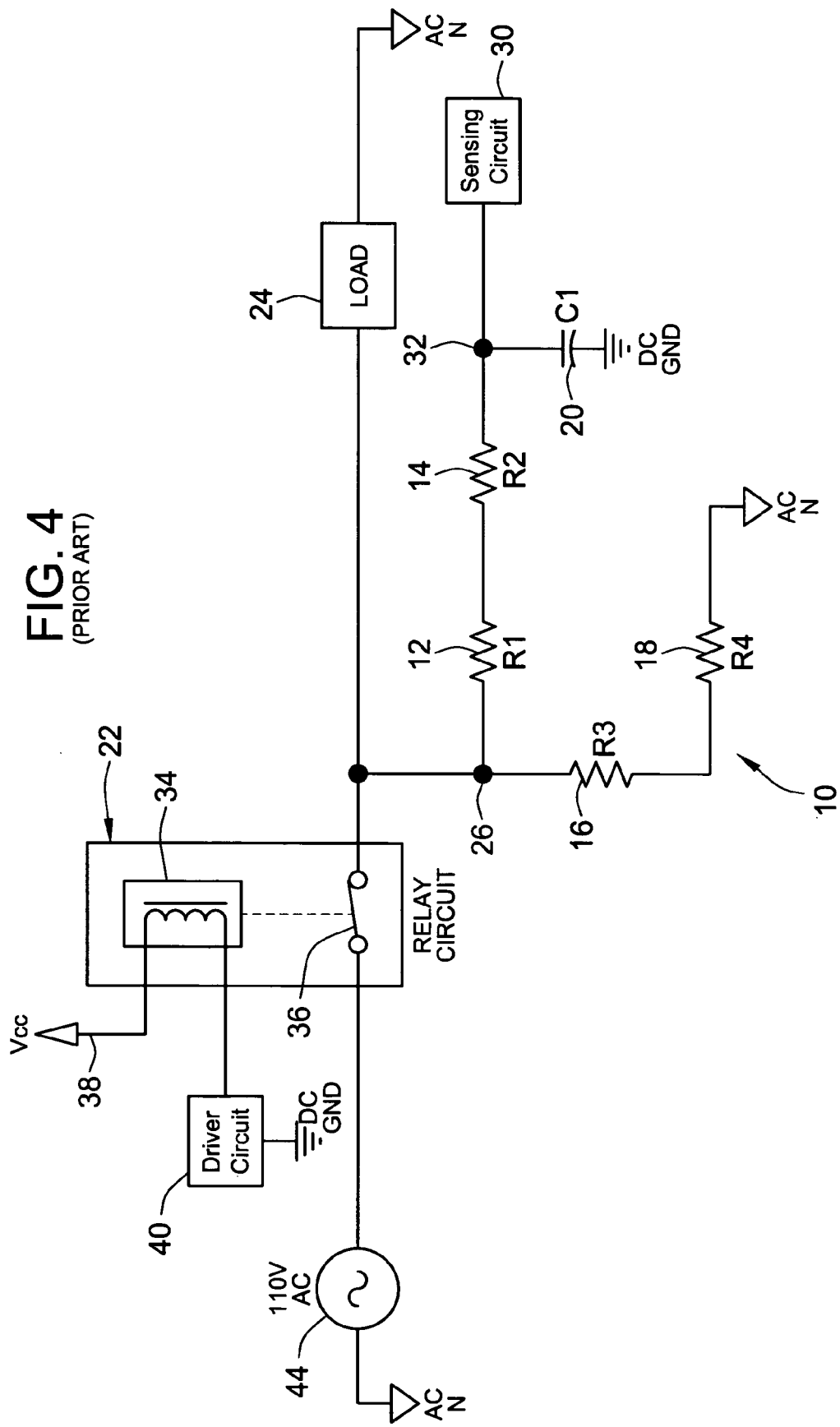
FIG. 4 is a schematic of the prior art diagnostic circuit system of FIG. 2 having a "closed" relay circuit and a connected load.
Figure 5:
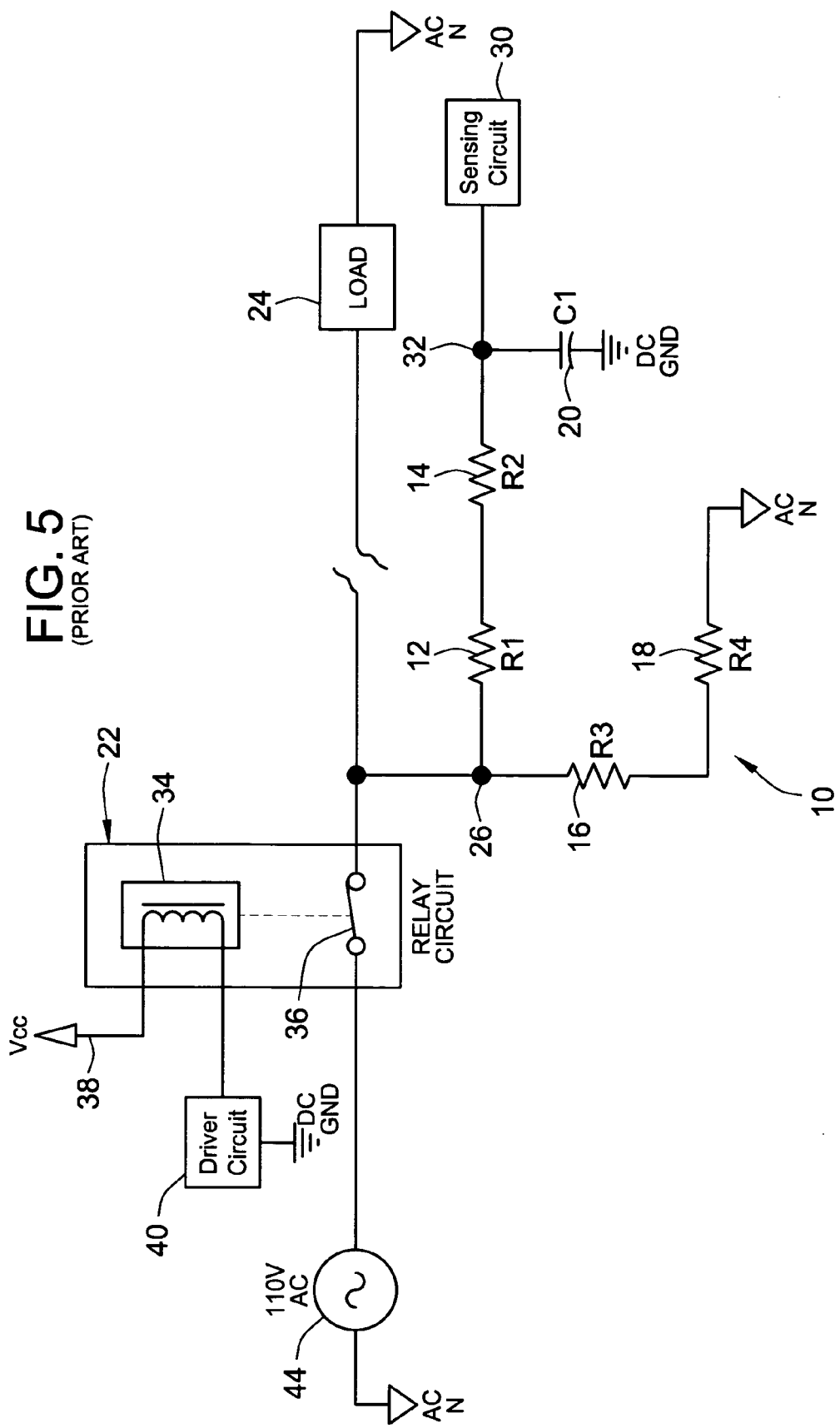
FIG. 5 is a schematic of the prior art diagnostic circuit system of FIG. 2 having a "closed" relay circuit and a disconnected load.
Figure 7:
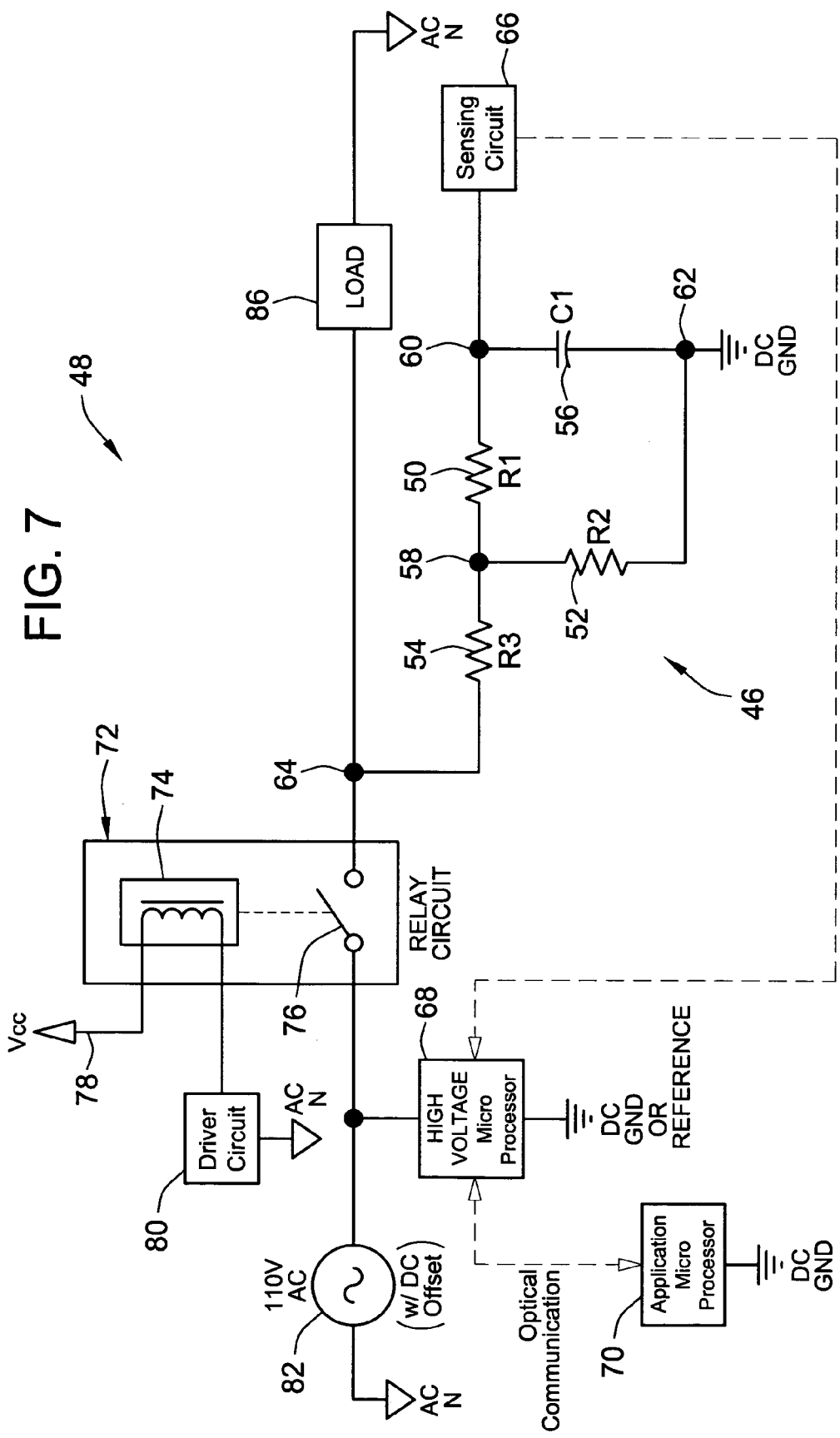
FIG. 7 is a schematic of an exemplary embodiment of a diagnostic circuit system constructed in accordance with the teachings of the present invention and having an "open" relay circuit and a connected load.

Referring to FIG. 7, an exemplary embodiment of a diagnostic circuit 46 within a diagnostic circuit system 48 is illustrated. Diagnostic circuit 46 comprises a first resistor 50, a second resistor 52, a third resistor 54, and a capacitor 56. The first resistor 50 is disposed between a node 58 and a sensing node 60. The capacitor 56 is disposed between the sensing node 60 and a ground node 62. The second resistor 52 is disposed between the node 58 and the ground node 62. The third resistor 54 is disposed between the node 58 and a load node 64.

In an exemplary embodiment, the first resistor 50 is a one mega ohm (1 MΩ) resistor, the second resistor 52 is a 470 kilo ohm (470 kΩ) resistor, the third resistor 54 is a 100 kilo ohm (100 kΩ) resistor, and the capacitor 56 is a 0.001 micro-farad (0.001 µF) capacitor rated at 100 volts. These particular component values are selected to produce certain voltages corresponding to a "logic low" and a "logic high" at sensing node 60. Should different voltage levels be desired for the logic low and logic high, the component values can be modified.

The diagnostic circuit 46 is coupled to a sensing circuit 66 at the sensing node 60. The sensing circuit 66 can include, or be coupled to, a high-voltage microprocessor 68 (a.k.a., a control). As shown, the sensing circuit 66 can communicate directly with, and can be coupled to, the high-voltage microprocessor 68 if the two components are separated. In an exemplary embodiment, the high-voltage microprocessor 68 is optically bi-directionally coupled to an application microprocessor 70. Since the high-voltage microprocessor 68 and the application microprocessor 70 are coupled via an optical connection, the two microprocessors are maintained in isolation from one another.

The diagnostic circuit 46 is connected to monitor the operation of a relay circuit 72 at the load node 64. The relay circuit 72 includes an electromagnetic coil 74 and a switch 76. The electromagnetic coil 74 is coupled to a direct current power source 78 and a drive circuit 80.

The switch 76 of the relay circuit 72 is connected to an alternating-current (AC) voltage source 82. In preferred embodiments, the alternating-current voltage source 82 is a one hundred and ten volt (110 V) source with a five volt (5 V) direct current voltage offset. In an exemplary embodiment, the microcontroller or microprocessor 68 is hot (i.e., not isolated by a transformer). The high-voltage microprocessor 68 is shown coupled to the alternating-current voltage source 82 and the relay circuit 72. Even so, the high-voltage microprocessor 68 can be coupled elsewhere relative to the diagnostic circuit 46 and/or the diagnostic circuit system 48.

Figure 8:
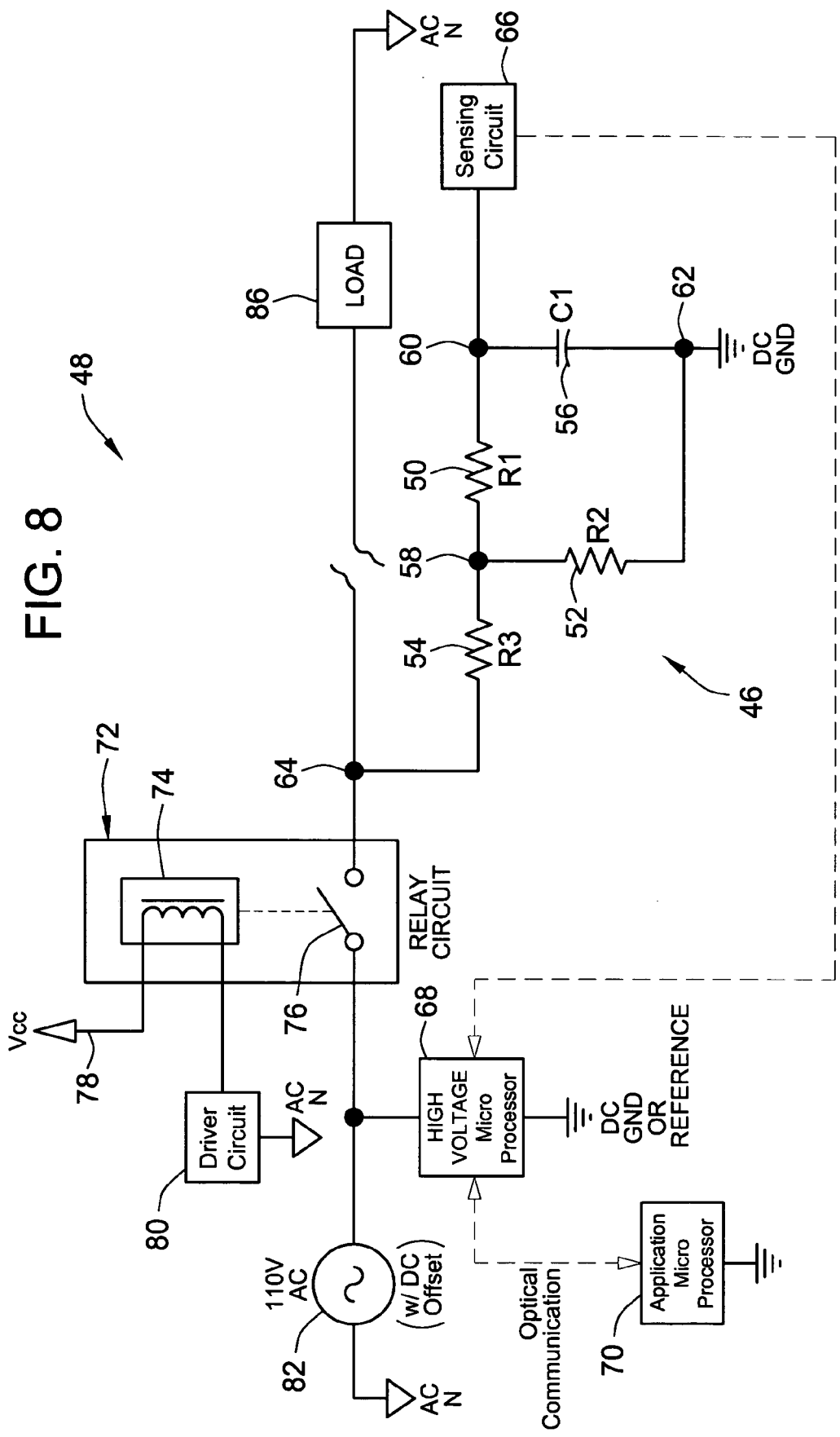
FIG. 8 is a schematic of the diagnostic circuit system of FIG. 7 having an "open" relay circuit and a disconnected load.

As shown in FIG. 7, a load 86 is preferably connected to the relay circuit 72 at the load node 64. Due to load faults, broken wires, open loads, and the like, the load 86 is, at times, undesirably disconnected from the relay circuit 72 and the diagnostic circuit system 48 as illustrated in FIG. 8. Unlike the prior diagnostic circuits discussed above, the diagnostic circuit 46 is able to detect the presence and absence of the load 86 as well as monitor the proper operation of the relay circuit 76.

In operation, as shown in FIG. 7, when the switch 76 in the relay circuit 72 is open (i.e., the electromagnetic coil 74 is de-energized), and the load 86 is connected or present, the diagnostic circuit 46 generates an oscillating voltage of about one hundred volts (100 V) at sixty Hertz (60 Hz) at the sensing node 58. The resistor R1 50 current limits the 100 V signal to the sensing circuit 66. In an alternate embodiment, a clamping diode is used to protect the sensing circuit 66. This oscillating voltage is sensed or detected by the sensing circuit 66. As a result of seeing an oscillating voltage at node 60, the sensing circuit 66 reports to the high-voltage microprocessor 68 that the load is present or connected.

Turning to FIG. 8, when switch 76 in relay circuit 72 is again open, but the load 86 is disconnected, the diagnostic circuit 46 generates a logic low (e.g., 0 volts) at the sensing node 60. This logic low is sensed or detected by the sensing circuit 66. As a result of seeing the logic low at node 60, the sensing circuit 66 reports to the high-voltage microprocessor 68 that the load is missing or disconnected. Notably, the diagnostic circuit 46 is able to determine that the load 86 is not present when the switch 76 is open. Thus, the diagnostic circuit 46 alerts the sensing circuit 66 if the load is connected or disconnected before the relay circuit 72 is closed.

Figure 9:
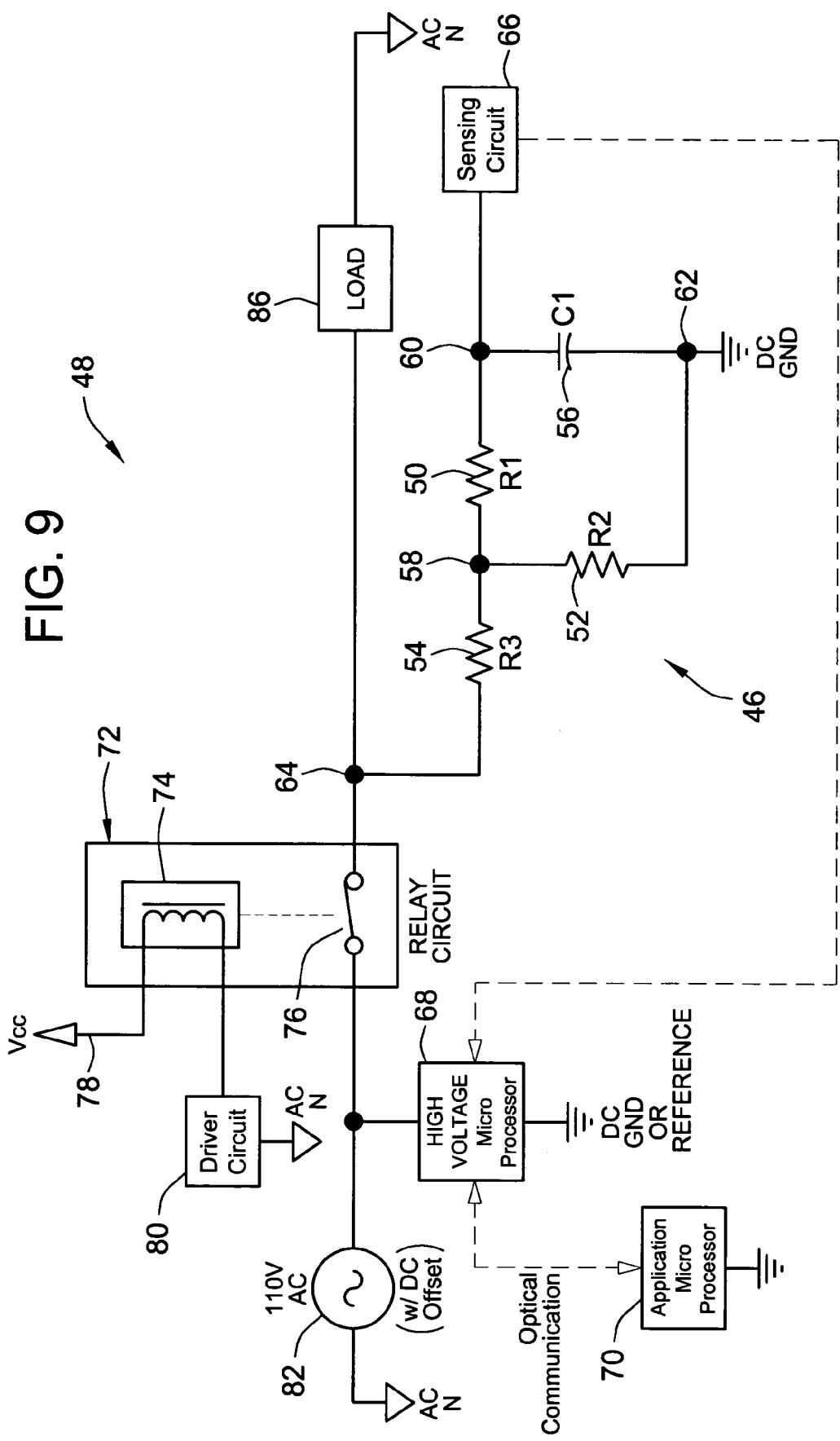
FIG. 9 is a schematic of the diagnostic circuit system of FIG. 7 having an "open" relay circuit and a disconnected load.

Referring to FIG. 9, after the diagnostic circuit 46 and the sensing circuit 66 have operated to determine if the load 86 is connected or disconnected, the switch 76 in the relay circuit 72 can be closed. With the switch 76 closed, the diagnostic circuit 46 generates a logic high (e.g., 5 volts) at the sensing node 60. This logic high is sensed or detected by the sensing circuit 66. As a result of seeing the logic high at node 60, the sensing circuit 66 reports to the high-voltage microprocessor 68 that the relay circuit 72 is functioning properly. Node 60 stays at the logic high until the switch 76 in the relay circuit 72 is once again opened, regardless of the presence of the load 86.

In summary, as shown in the truth table of FIG. 10, the diagnostic circuit 46 generates an oscillating voltage at sensing node 60 when the relay circuit 72 is open and the load 86 is connected, generates a logic low at sensing node 60 when the relay circuit 72 is open and the load 86 is disconnected, and generates a logic high when the relay circuit 72 is closed. As the truth table illustrates, the diagnostic circuit 46 can determine whether the load 86 is present or missing before the relay circuit 72 is actuated. This allows the detection and isolation of a failed load/wiring condition that otherwise might be identified as a failed relay. Moreover, the diagnostic circuit 46 can confirm that the relay circuit 72 is operating properly regardless of the presence of the load.

The diagnostic circuit 46 of the present invention provides many advantages. First, the diagnostic circuit 46 of the present invention has fewer parts than the known diagnostic circuit 10 discussed above. Moreover, the diagnostic circuit 46 senses a voltage or a change in voltage as opposed to sensing a current level or lack of current like the known diagnostic circuit 10. Further, the diagnostic circuit 46 and diagnostic circuit system 48 permit board versus load fault detection. As such, faults can be more easily located and remedied by, for example, an appliance technician.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A floating diagnostic circuit coupled to a load node between a relay circuit and a load, comprising:
    a first resistor disposed between a node and a sensing node;
    a capacitor disposed between the sensing node and a ground node;
    a second resistor disposed between the node and the ground node, the second resistor coupled to the first resistor at the node and coupled to the capacitor at the ground node; and
    a third resistor disposed between the node and the load node, the third resistor coupled to the first resistor and the second resistor at the node.

2. The diagnostic circuit of claim 1, wherein the sensing node experiences an oscillating signal when the relay circuit is open and the load is coupled to the load node.

3. The diagnostic circuit of claim 1, wherein the sensing node experiences a logic low when the relay circuit is open and the load is electrically disconnected from the load node.

4. The diagnostic circuit of claim 1, wherein the sensing node experiences a logic high when the relay circuit is closed.

5. The diagnostic circuit of claim 1, wherein the sensing node experiences one of a logic high, a logic low, and an oscillating signal.

6. The diagnostic circuit of claim 1, wherein a controller is coupled to the diagnostic circuit at the sensing node to monitor the sensing node.

7. The diagnostic circuit of claim 6, wherein the controller monitors a voltage at the sensing node.

8. The diagnostic circuit of claim 7, wherein the controller comprises a high-voltage microprocessor.

9. The diagnostic circuit of claim 8, further comprising an isolated application microprocessor, and wherein the high-voltage microprocessor is optically bi-directionally coupled to the isolated application microprocessor.

10. A diagnostic circuit system for determining the proper operation of a relay circuit and the status of a connection of a load thereto, comprising:
a diagnostic circuit having a first resistor disposed between a node and a sensing node, a capacitor disposed between the sensing node and a ground node, a second resistor disposed between the node and the ground node, a third resistor disposed between the node and a load node, the third resistor coupled to the first resistor and the second resistor at the node;
a sensing circuit coupled to the diagnostic circuit at the sensing node; and wherein the diagnostic circuit generates a high voltage at the sensing node when the relay circuit is closed, a low voltage when the relay circuit is open and the load is disconnected from the relay circuit, and an oscillating voltage when the relay circuit is open and the load is connected to the relay circuit.

11. The diagnostic circuit system of claim 10, wherein the sensing circuit includes a high-voltage microprocessor.

12. The diagnostic circuit system of claim 11, further comprising an isolated application microprocessor, and wherein the high-voltage microprocessor optically bi-directionally communicates with the isolated application microprocessor.

13. A diagnostic circuit system, comprising:
a diagnostic circuit, the diagnostic circuit having:
a first resistor disposed between a node and a sensing node;
a capacitor disposed between the sensing node and a ground node, the capacitor coupled to the first resistor at the sensing node such that the first resistor and capacitor are in series;
a second resistor disposed between the node and the ground node, the second resistor coupled to the first resistor at the node and coupled to the capacitor at the ground node such that the second resistor is in parallel with the first resistor and the capacitor;
a third resistor disposed between the node and a load node, the third resistor coupled to the first resistor and the second resistor at the node such that the third resistor is in series with the second resistor and the first resistor and the capacitor;
a relay circuit coupled to the diagnostic circuit at the load node;
a sensing circuit coupled to the diagnostic circuit at the sensing node; and
wherein the diagnostic circuit generates, and the sensing circuit detects, one of an oscillating signal, a logic high, and a logic low such that a presence of a load and proper operation of the relay circuit are confirmed.

14. The diagnostic circuit system of claim 13, wherein the sensing circuit includes a high-voltage microprocessor that optically bi-directionally communicates with an application microprocessor.

15. The diagnostic circuit system of claim 13, wherein the sensing node experiences an oscillating signal when the relay circuit is open and the load is coupled to the load node.

16. The diagnostic circuit system of claim 13, wherein the sensing node experiences a logic low when the relay circuit is open and the load is electrically disconnected from the load node.

17. The diagnostic circuit system of claim 13, wherein the sensing node experiences a logic high when the relay circuit is closed.

18. The diagnostic circuit system of claim 13, wherein the sensing node experiences one of a logic high, a logic low, and an oscillating signal.

19. The diagnostic circuit system of claim 13, wherein a controller is coupled to the diagnostic circuit at the sensing node to monitor the sensing node.

20. The diagnostic circuit system of claim 13, wherein the controller monitors a voltage at the sensing node.

* * * * *